(12) United States Patent
Kinzer et al.

(10) Patent No.: US 8,115,260 B2
(45) Date of Patent: Feb. 14, 2012

(54) WAFER LEVEL STACK DIE PACKAGE

(75) Inventors: Dan Kinzer, San Jose, CA (US); Yong Liu, Scarborough, ME (US); Stephen Martin, South Portland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 29 days.

(21) Appl. No.: 12/683,058

(22) Filed: Jan. 6, 2010

(65) Prior Publication Data

US 2011/0163391 A1 Jul. 7, 2011

(51) Int. Cl.
*H01L 27/088* (2006.01)

(52) U.S. Cl. ........ 257/401; 257/500; 257/724; 257/774; 257/E23.169; 257/E27.06

(58) Field of Classification Search .................. 257/401, 257/500, 724, 774, E23.169, E27.06
See application file for complete search history.

(56) References Cited

U.S. PATENT DOCUMENTS

| | | | |
|---|---|---|---|
| 5,191,405 A | 3/1993 | Tomita et al. | |
| 5,579,207 A | 11/1996 | Hayden et al. | |
| 6,682,955 B2 | 1/2004 | Cobbley et al. | |
| 2009/0174046 A1 | 7/2009 | Liu et al. | |
| 2009/0230537 A1 | 9/2009 | Liu et al. | |
| 2009/0278241 A1 | 11/2009 | Liu et al. | |
| 2010/0123257 A1 | 5/2010 | Liu | |
| 2011/0079917 A1* | 4/2011 | Xia et al. | 257/774 |
| 2011/0121808 A1* | 5/2011 | Girdhar et al. | 323/311 |

OTHER PUBLICATIONS

Barnat, Samed, et al., "Virtual prototyping of a Wafer Level Chip Scale Package: Underfill role in die cracking", *10th International Conference on Thermal, Mechanical and Multi-Physics simulation and Experiments in Microelectronics and Microsystems, 2009. EuroSimE 2009.*, (2009), 1-6.

Sakuma, K, et al., "Characterization of stacked die using die-to-wafer integration for high yield and throughput", *58th Electronic Components and Technology Conference, 2008. ECTC 2008.*, (May 2008), 18-23.

Takamiya, M., et al., "3D-structured on-chip buck converter for distributed power supply system in SiPs", *IEEE International Conference on Intergrated Circuit Design and Technology and Tutorial, 2008. ICICDT 2008.*, (Jun. 2008), 4 pgs..

Yang, Daoguo, et al., "Reliability modeling on a MOSFET power package based on embedded die technology", *10th International Conference on Thermal, Mechanical and Multi-Physics simulation and Experiments in Microelectronics and Microsystems, 2009. EuroSimE 2009.*, (2009), 1-6.

* cited by examiner

*Primary Examiner* — Bradley K Smith
*Assistant Examiner* — Marvin Payen
(74) *Attorney, Agent, or Firm* — Schwegman, Lundberg & Woessner, P.A.

(57) ABSTRACT

This document discusses, among other things, an IC package including first and a second discrete components fabricated into a semiconductor substrate. The first and second discrete components can be adjacent to one another in the semiconductor substrate, and an integrated circuit die can be mounted on the semiconductor substrate and coupled to the first and second discrete components.

12 Claims, 6 Drawing Sheets

WAFER LEVEL STACK DIE PACKAGE

BACKGROUND

Electronic devices, such as cell phones, personal data assistants, digital cameras, laptops, etc., generally include several packaged semiconductor integrated circuit (IC) chips and surface mount components assembled onto interconnect substrates. There is continual market demand to incorporate more functionality and features into electronic devices, while simultaneously decreasing the size of the electronic devices. This, in turn, has placed increasing demands on the design, size, and assembly of interconnect substrates. As the number of assembled components increases, substrate areas and costs increase, while demand for smaller form factor increases.

OVERVIEW

This document discusses, among other things, an IC package including a monolithic circuit having an IC die mounted thereon with a mold compound disposed over the IC die to form the IC package. The monolithic circuit can include first and a second discrete components fabricated in a semiconductor substrate adjacent to one another. The IC die can be mounted to a passive side of the semiconductor substrate and coupled to the first and second discrete components with a plurality of through substrate vias. The IC package can include a plurality of bond pads on the active side of the semiconductor substrate for mounting the IC package to an interconnect substrate.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that a compact IC package can be created by fabricating at least one discrete component in a semiconductor substrate (e.g. a silicon wafer) and mounting an IC die on the semiconductor substrate. The IC die can then be covered with an electrically insulating material (e.g. a mold compound) and diced to form the IC package. In an example, the IC package can include a plurality of contact regions for flip-chip mounting to an interconnect substrate (e.g. a printed circuit board).

In an example, the IC die within the IC package is flip-chip mounted to a passive side of the semiconductor substrate and electrically coupled to the discrete component. The semiconductor substrate can include a plurality of through substrate vias the can electrically couple the IC die to the discrete component and to the plurality of contact regions on the active side of the semiconductor substrate.

Figure 1:
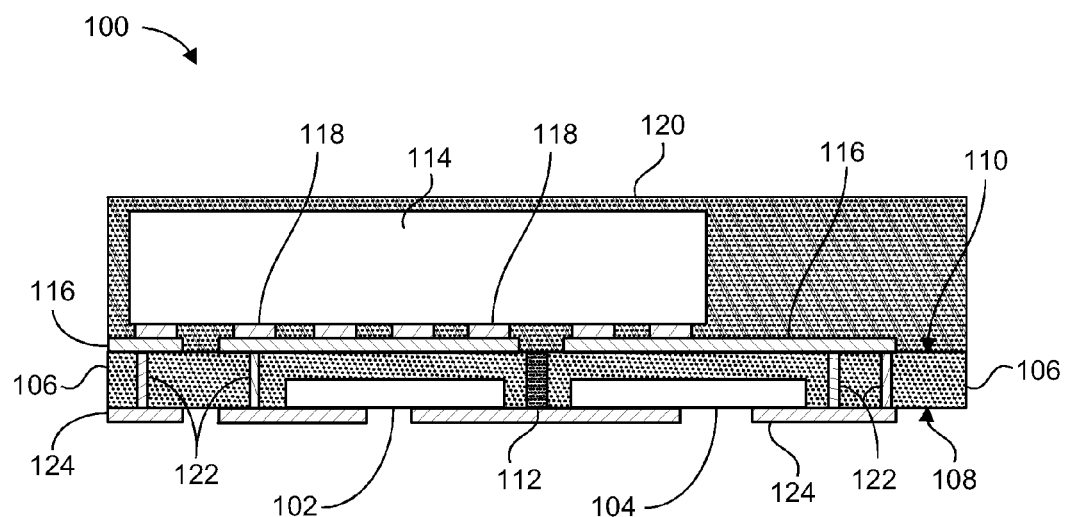
FIG. 1 illustrates generally a cross-sectional view of an example of a wafer level stacked die IC package.

FIG. 1 illustrates generally a cross-section view of an example of an IC package 100. The IC package 100 can include a first discrete component 102 and a second discrete component 104 fabricated into a semiconductor substrate 106. In other words, the first and second discrete components 102, 104 along with the semiconductor substrate 106 form a monolithic integrated circuit. In an example, the semiconductor substrate 106 can include a silicon wafer. In other examples, the semiconductor substrate 106 can include germanium, gallium arsenide, silicon carbine or layered semiconductor substrates (e.g. silicon on insulator). In some examples, the semiconductor substrate 106 can be doped as known to those skilled in the art. As referred to herein, the semiconductor substrate 106 includes an active side 108 and a passive side 110. The active side 108 of the semiconductor substrate 106 can include a surface of the semiconductor substrate 106 having the first and second discrete components 102, 104 fabricated therein. The passive side 110 of the semiconductor substrate 106 is opposite the active side 108.

In an example, the first and second discrete components 102, 104 are adjacent to one another within the semiconductor substrate 106. In an example, the semiconductor substrate 106 can include an isolation gap 112 disposed between the first and second discrete components 102, 104 for electrically isolating the first discrete component 102 from the second discrete component 104. In an example, the isolation gap 112 is formed by etching a groove in the semiconductor substrate 106 and depositing an electrically insulating material in the groove. In an example, the electrically insulating material can include a mold compound such as an epoxy, a silicone, a polyimide, or a combination of the one or more of these materials. In an example, the width of the isolation gap 112 can be based on the voltage present at the first and second discrete components 102, 104. Notably, when a higher voltage can be present at either the first or second discrete component 102, 104 the isolation gap 112 should be wider to provide increased electrical insulation.

In an example, the IC package 100 can also include a plurality of through substrate vias 122 which in combination with conductive layers 116 and 124 electrically couple the first and second discrete components 102, 104 on the active side 108 of the semiconductor substrate 106 to elements on the passive side 110 of the semiconductor substrate 106. In other words, the plurality of through substrate vias 122 (e.g.

through silicon vias (TSVs) when the semiconductor substrate 106 is silicon) provide electrical coupling between the active side 108 and the passive side 110 through the semiconductor substrate 106. Each of the plurality of through substrate vias 122 are formed by etching an aperture through the semiconductor substrate 106 and depositing a conductive material within the aperture. In some examples, the conductive material can include tungsten.

In certain examples, the IC package 100 can include an IC die 114 mounted on the semiconductor substrate 106 and electrically coupled to the first and second discrete components 102, 104. The IC die 114 and the first and second discrete components 102, 104 form an electrical circuit for the IC package 100. In an example, the IC die 114 is mounted on the passive side 110 of the semiconductor substrate 106. The IC die 114 is electrically coupled to the first and second discrete components 102, 104 with the plurality of through substrate vias 122.

In an example, a first patterned conductive layer 116 can be disposed on the passive side 108 of the semiconductor substrate 106. The first patterned conductive layer 116 provides electrical coupling of the IC die 114 to the plurality of through substrate vias 122. The first patterned conductive layer can also provide coupling between different contacts on the IC die 114. In an example, the first patterned conductive layer is fabricated on the passive side 110 of the semiconductor substrate 106 such that a portion of the patterned conductive layer 116 is disposed between the IC die 114 and the semiconductor substrate 106. The first patterned conductive layer 116 can include a plurality of traces for electrically coupling the IC die 114 to the plurality of through substrate vias 122. In an example, the first patterned conductive layer 116 can also include a plurality of conductive regions (e.g. bond pads) for mounting and electrical coupling of IC die 114 to the patterned conductive layer 116. In an example, the IC die 114 can be flip chip mounted to the patterned conductive layer 116. In an example, the IC die 114 can use a ball grid array of solder balls 118 to electrically and physically couple the IC die 114 to the first patterned conductive layer 116.

The IC die 114 can be electrically coupled to the first and second discrete components 102, 104 using at least one of the plurality of through substrate vias. For example, the IC die 114 can be coupled to the first patterned conductive layer 116 which is coupled to the through substrate vias 122. The through substrate vias 122 can then be coupled to the first and second discrete components 102, 104. In an example, a second patterned conductive layer 124 is fabricated on the active side 108 of the semiconductor substrate 106 for coupling the plurality of through substrate vias 122 to the first and second discrete components 102, 104.

In an example, the IC package 100 can include a plurality of conductive regions for physically mounting and electrically coupling the IC package 100 to an interconnect substrate (e.g. a printed circuit board). In an example, the plurality of conductive regions can be externally exposed portions of the second patterned conductive layer 124. In an example, the second patterned conductive layer 124 electrically couples the IC die 114 to at least one of the plurality of conductive regions for external electrical connection. Although the IC die 114 is shown as being coupled to the passive side 110 of the semiconductor substrate 106, in other examples, the IC die 114 can be coupled to the active side 108 of the semiconductor substrate 106 and the plurality of conductive regions for coupling the IC package 100 to an interconnect substrate are disposed on the passive side 110 of the semiconductor substrate 106. In an example, the input/output pins for IC die 114 are coupled to contact regions 124 with one (or more) of the plurality of through substrate vias 122.

In an example, an electrically insulating material 120 is disposed over the IC die 114 and at least a portion of the passive side 110 of the semiconductor substrate 106. The electrically insulation material 120 electrically insulates the IC die 114 from external influences. In an example, the electrically insulating material 120 can include a mold compound such as an epoxy, a silicone, a polyimide, or a combination of the one or more of these materials. In an example, the electrically insulating material 120 is disposed such that the IC die 114 back (bottom) surface is exposed for better thermal dissipation.

In an example, the first and second discrete components 102, 104 can include transistors and the IC die 114 can include a controller for the transistors. In particular, the first and second discrete components can include a high-side and a low-side metal oxide semiconductor field effect transistors (MOSFETs) which together with IC die 114 form a power converter. In a particular example, the power converter can include a buck converter.

Figure 2:
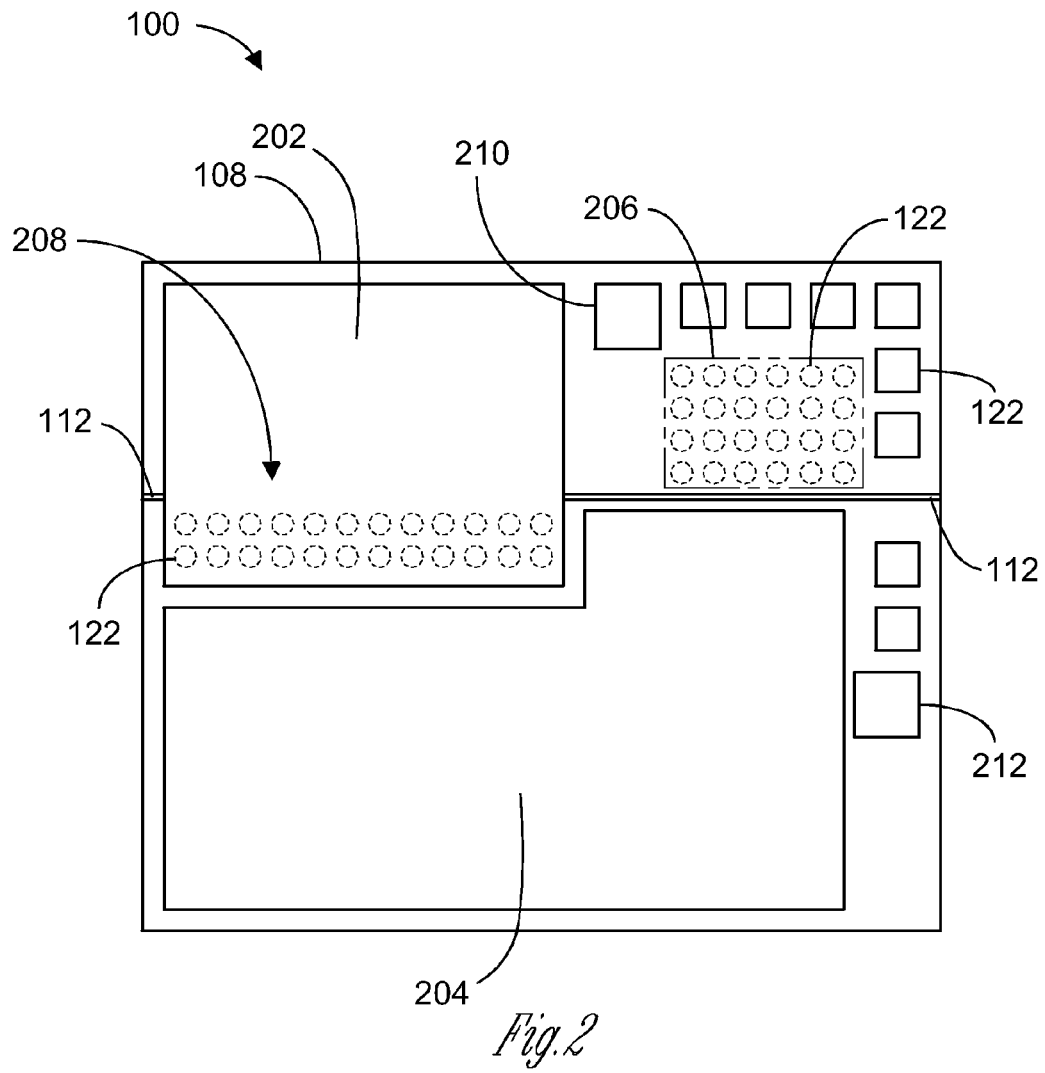
FIG. 2 illustrates generally a bottom cross-sectional view of the wafer level stacked die IC package of FIG. 1.

FIG. 2 illustrates generally a bottom cross-sectional view of an example of IC package 100 from FIG. 1. FIG. 2 illustrates the active side 108 of the semiconductor substrate 106 showing the second patterned conductive layer 124 and the plurality of through substrate vias 122. In an example, a first source region 202 of the second patterned conductive layer 124 can be coupled to the source of a high-side MOSFET. Additionally, in an example, a second source region 204 is coupled to the source of the low-side MOSFET.

In an example, the drain of the high-side and low side MOSFETs are coupled to through substrate vias 122 for coupling to the passive side 110 of the semiconductor substrate 106. In an example, the drain of the high-side MOSFET is coupled to a first group (shown generally at region 206) of through substrate vias 122 and the drain of the low-side MOSFET is coupled to a second group (shown generally at 208) of through substrate vias 122. In an example, the second patterned conductive layer 124 electrically couples the high-side source to the low-side drain. Accordingly, the drain of the low-side transistor is electrically coupled to the first source region 202. In an example, the first source region 202 and the second source region 204 can include large surface areas. The large surface areas on the active side 108 of the semiconductor substrate 106 coupled to the sources of the high-side and low-side MOSFETs can provide good thermal performance due to the large area of heat dissipation available for external bond pad placement (e.g. the plurality of conductive regions). Additionally, in an example, disposing the plurality of conductive regions on the active side 108 of the semiconductor substrate 106 positions the high-side and low-side MOSFETs near the plurality of conductive regions for efficient removal of heat from the high-side and low-side MOSFETs.

As shown in FIG. 2, a plurality of through substrate vias 122 (illustrated as squares) are used to couple the IC die 114 to external bond pads of the IC package 100. Additionally, FIG. 2 illustrates the isolation gap 112. The isolation gap 112 can include a groove extending across the semiconductor substrate 106 between the high-side MOSFET and the low-side MOSFET. FIG. 2 also illustrates a high-side gate region 210 that is coupled to the gate of the high-side MOSFET. A low side gate region 212 is also shown and is coupled to the gate of the low-side MOSFET.

Figure 3:
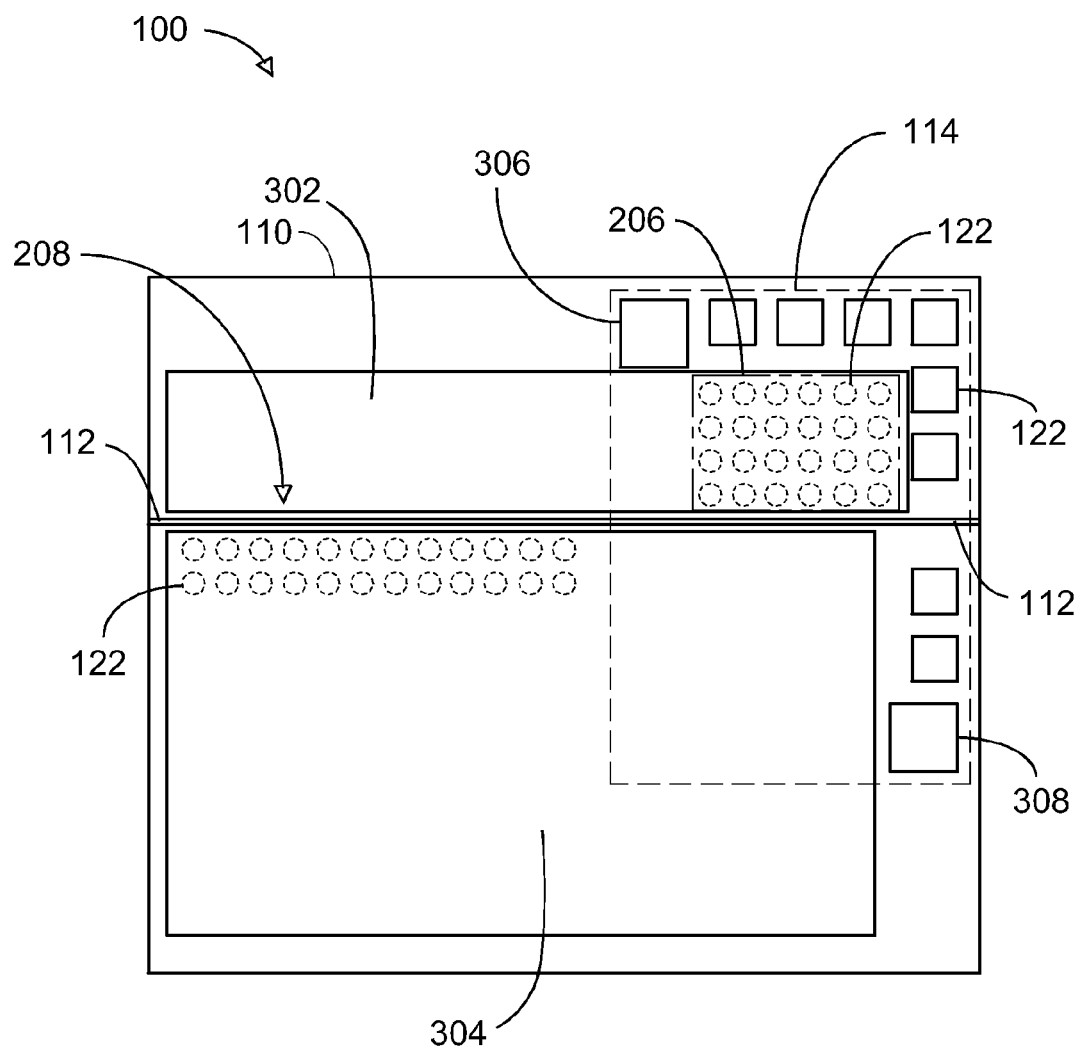
FIG. 3 illustrates generally a top cross-sectional view of an example of the wafer level stacked die IC package of FIG. 1.

FIG. 3 illustrates a generally a top cross-sectional view of an example of the passive side 110 of IC package 100. FIG. 3 illustrates the first patterned conductive layer 116 on the passive side 110 of the semiconductor substrate 106. As shown, the first group 206 of through substrate vias 122 couple to a first drain region 302 of the first patterned conductive layer 116 for the high-side drain. The first drain region 302 is in turn coupled to controller 114 (the dotted lines show the location of controller 114 on the passive side 110. Similarly, the second group 304 of through substrate vias 122 couple to a second drain region 304 for the low-side drain and the high-side source. The IC die 114 couples to the gate of the high-side MOSFET at region 306 and the gate of the low-side MOSFET at region 308. The IC die 114 can control the high-side MOSFET and the low-side MOSFET with the gate regions 306 and 308.

Figure 4:
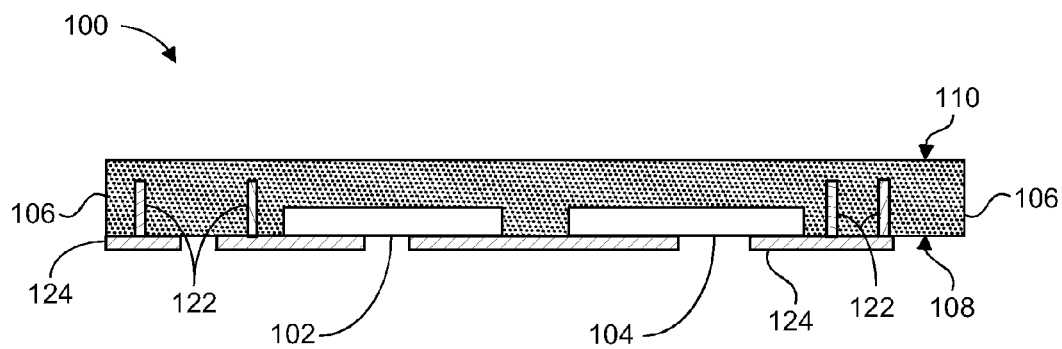
FIG. 4 illustrates an example of a first and second discrete semiconductor fabricated in a single semiconductor wafer.
Figure 5:
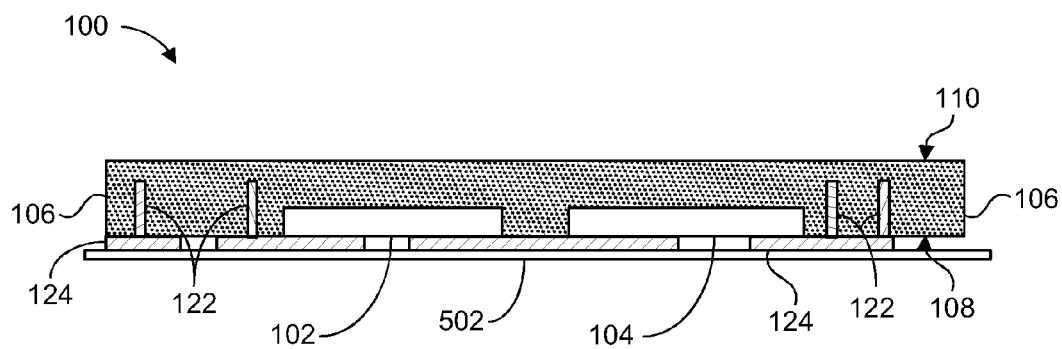
FIG. 5 illustrates an example of the semiconductor wafer of FIG. 4 mounted to a film carrier for support during the IC package construction.
Figure 6:
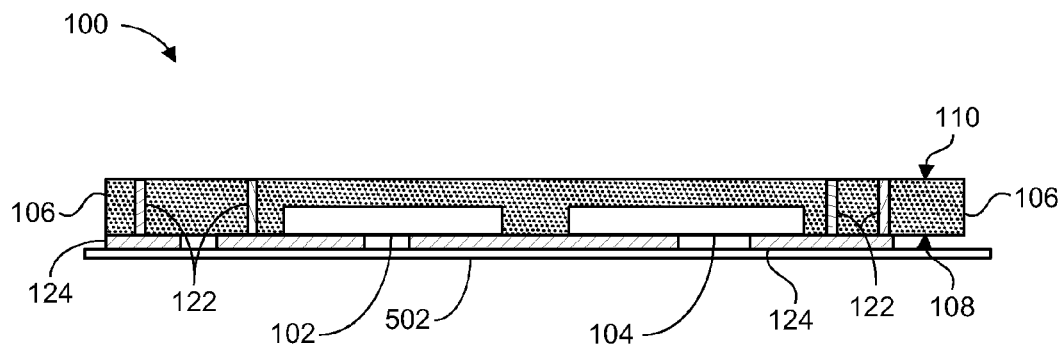
FIG. 6 illustrates an example of the semiconductor wafer of FIG. 5 thinned to expose the through substrate vias.
Figure 7:
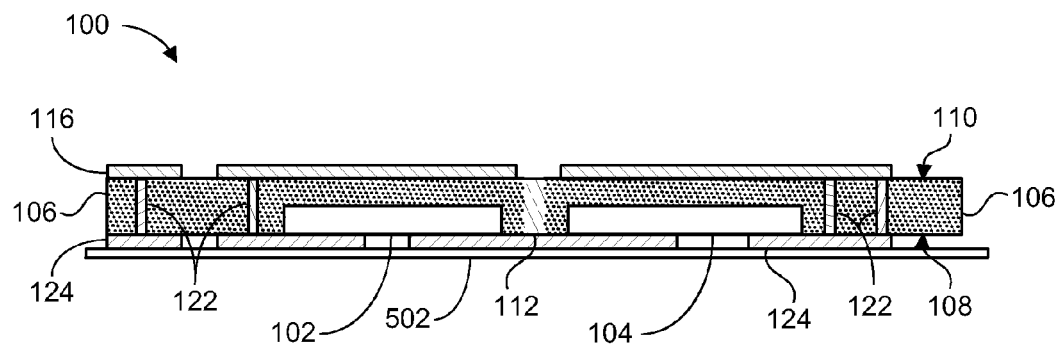
FIG. 7 illustrates an example of a patterned conductive layer added to the semiconductor wafer of FIG. 6.
Figure 8:
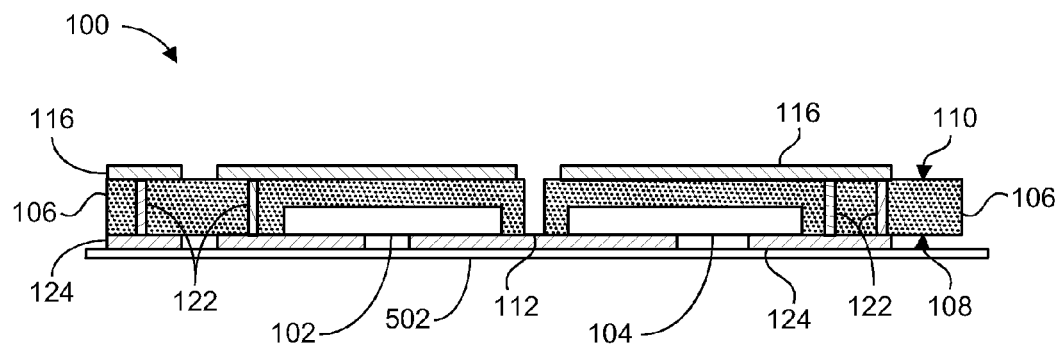
FIG. 8 illustrates an example of a groove etched into the semiconductor wafer of FIG. 7.
Figure 9:
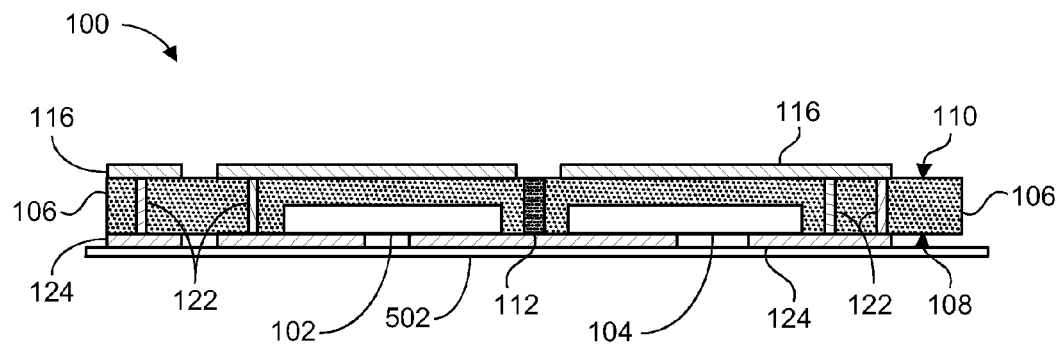
FIG. 9 illustrates an example of the groove of FIG. 8 filled with an electrically insulating material to form an isolation gap.
Figure 10:
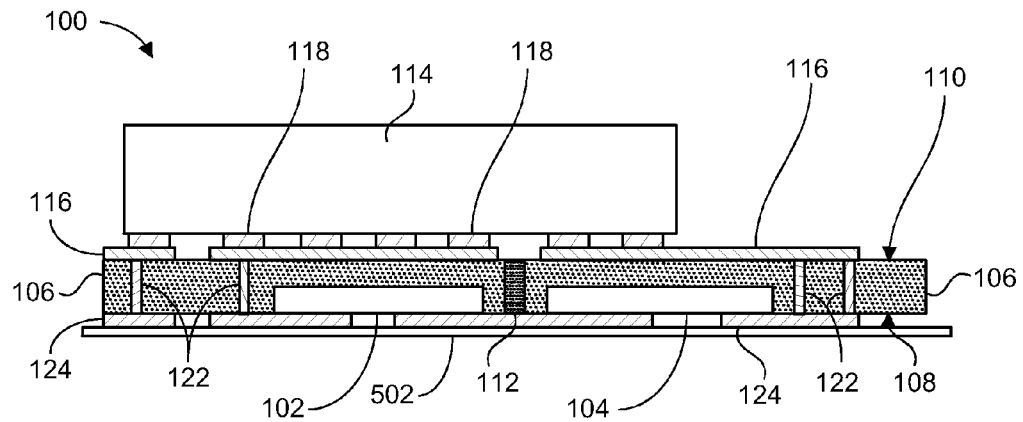
FIG. 10 illustrates an example of an IC die flip-chip mounted to the semiconductor wafer of FIG. 9.
Figure 11:
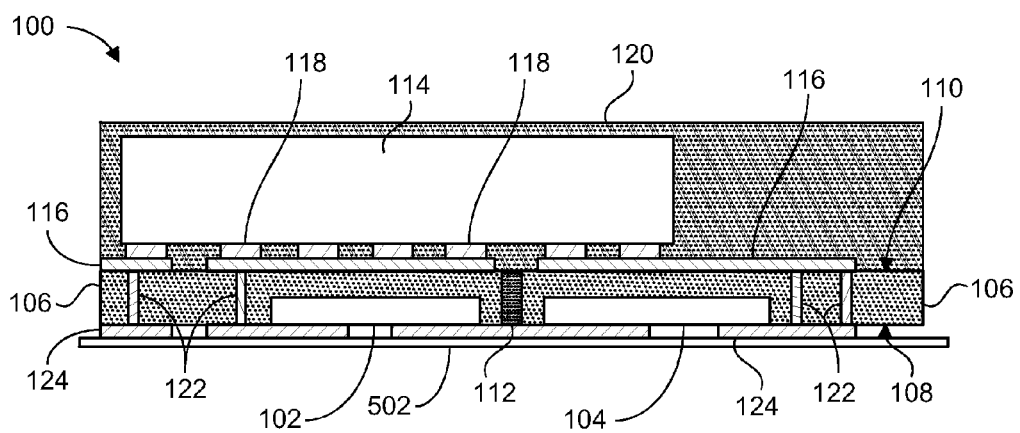
FIG. 11 illustrates an example of an electrically insulating material disposed around the IC die and the semiconductor wafer of FIG. 10.

FIGS. 4-11 illustrate a method for making a wafer level stack die IC package such as IC package 100. In FIG. 4, the first and second discrete semiconductors 102, 104 are fabricated in a single semiconductor wafer (e.g. substrate 106). In an example, fabricating can include multiple steps of masking and etching the semiconductor wafer and depositing appropriate materials to form the first and second discrete semiconductors in the semiconductor wafer. The active side 108 is then finished by etching and depositing a metal (e.g. tungsten) to form the through substrate vias 122. Next, the second patterned conductive layer 124 is added to the active side 108. At FIG. 5, the semiconductor wafer is mounted to a film carrier 502 for support during the IC package construction. At FIG. 6, the passive side 110 of the semiconductor wafer is thinned to expose the through substrate vias 122. In an example, the semiconductor wafer is thinned to around 25 micrometers. At FIG. 7, the first patterned conductive layer 116 is added to the passive side 110 of the semiconductor substrate 106. Adding the first patterned conductive layer 116 can include adding a thick copper metallization with a pattern for drain regions 302, 304 and regions for coupling to the through substrate vias 122. At FIG. 8, a groove 802 in the semiconductor substrate 106 for the isolation gap 112 is plasma etched in the passive side of the semiconductor substrate 106 between the first and second discrete components 102, 104. At FIG. 9, the groove 802 is filled with an electrically insulating material to form the isolation gap 112. In some examples, the electrically insulating material can include a high strength epoxy or a high strength glass. At FIG. 10, the IC die 114 is flip-chip mounted to the semiconductor substrate 106. At FIG. 11, the electrically insulating material is disposed around the IC die 114 and over the passive side 110 of the semiconductor substrate 106. The process illustrated in FIGS. 4-10 is completed in multiple locations on a single wafer and the wafer is then sawed to generate individual IC packages 100.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Additionally, in this document, when a first element, such as a material or IC die, is referred to as being "on" (e.g. mounted on) a second element, the first element can be directly on the second element, or intervening elements can also be present. In this document, when a first element, such as a layer, a region, or a substrate, is referred to as being "coupled to" a second element, the first element can be directly coupled to the second element, or the one or more intervening elements can be present. In contrast, when a first element is referred to as being "directly on" or "directly coupled to" another element, there are no intervening elements present.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code may be tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
   a semiconductor substrate;
   a first discrete component within the semiconductor substrate;
   a second discrete component within the semiconductor substrate, wherein the first discrete component is adjacent to the second discrete component; and
   an integrated circuit (IC) die mounted on the semiconductor substrate and coupled to the first discrete component and the second discrete component,
   wherein the semiconductor substrate includes an active side that includes the first and second discrete components and a passive side opposite the active side, and
   wherein the IC die is mounted to the passive side of the semiconductor substrate.

2. The apparatus of claim 1, wherein the semiconductor substrate includes a silicon wafer.

3. The apparatus of claim 1, wherein the apparatus includes a plurality of through substrate vias, wherein a first through substrate via is coupled to the first discrete component and a second through substrate via is coupled to the second discrete component; and
   a patterned conductive layer on the passive side of the semiconductor substrate, the patterned conductive layer coupled to the first and second through substrate vias, wherein the IC die is coupled to the first through substrate via and the second through substrate via by the patterned conductive layer.

4. The apparatus of claim 3, comprising a plurality of conductive regions on the active side of the semiconductor substrate for coupling to an external interconnect substrate, wherein at least one through substrate via couples the IC die to at least one conductive region.

5. The apparatus of claim 3, wherein the first discrete component includes a first transistor, the second discrete component includes a second transistor, and the IC die includes a controller configured to control operation of the first and second transistor such that the apparatus operates as a power converter.

6. The apparatus of claim 5, wherein the first transistor includes a high side metal-oxide semiconductor field effect transistor (MOSFET) and the second transistor includes a low side MOSFET, wherein at least one through substrate via couples a source of the high side MOSFET to a drain of the low side MOSFET.

7. The apparatus of claim 1, comprising an isolation gap in the semiconductor substrate between the first discrete component and the second discrete component.

8. The apparatus of claim 1, wherein the isolation gap includes a groove etched in the semiconductor substrate with an insulator deposited in the groove.

9. The apparatus of claim 1, wherein the IC die is flip chip mounted to the semiconductor substrate.

10. The apparatus of claim 1, comprising an electrically insulating material disposed over the IC die and at least a portion of the passive side of the semiconductor substrate.

11. A power converter comprising:
    a silicon wafer having an active side and a passive side;
    a high side transistor within the active side of the silicon wafer;
    a low side transistor within the active side of the silicon wafer, the low side transistor adjacent to the high side transistor;
    an isolation gap formed in the silicon wafer between the high side transistor and the low side transistor;
    a plurality of through silicon vias, wherein a first through silicon via is coupled to a drain of the high side transistor and a second through silicon via is coupled to a drain of the low side transistor;
    a patterned conductive layer deposited on the passive side of the silicon wafer;
    an integrated circuit (IC) die mounted to the passive side of the silicon wafer and coupled to the patterned conductive layer, the IC die including a controller for the high side transistor and the low side transistor, wherein the first and second discrete components are coupled to the IC die by the patterned conductive layer coupling the first and second through silicon via to the IC die;
    an electrically insulating material disposed over the IC die and at least a portion of the passive side of the silicon wafer; and
    a plurality of bond pads on the active side of the silicon wafer configured to couple to a printed circuit board, at least one bond pad coupled to the high side transistor, at least one bond pad coupled to the low side transistor, and at least one bond pad coupled to a through silicon via that is coupled to the IC die.

12. The power converter of claim 11, wherein the plurality of bond pads are configured to flip-chip mount to a printed circuit board.

* * * * *